United States Patent [19]
Bobeck

[11] 4,345,317
[45] Aug. 17, 1982

[54] MAGNETIC DOMAIN MEMORY WITH HALL EFFECT DETECTOR

[75] Inventor: Andrew H. Bobeck, Chatham, N.J.

[73] Assignee: Bell Telephone Laboratories, Incorporated, Murray Hill, N.J.

[21] Appl. No.: 172,374

[22] Filed: Jul. 25, 1980

[51] Int. Cl.³ .................................. G11C 19/08
[52] U.S. Cl. ............................................. 365/9
[58] Field of Search ............... 365/19, 20, 21, 9, 8, 365/7, 10, 37

[56] References Cited

U.S. PATENT DOCUMENTS

| | | | |
|---|---|---|---|
| 3,638,206 | 1/1972 | Thiele | 365/37 |
| 3,701,126 | 10/1972 | Reichard | 365/9 |
| 3,967,002 | 6/1976 | Almasi et al. | 365/37 |
| 4,142,247 | 2/1979 | Bobeck | 365/19 |
| 4,162,537 | 7/1979 | Bobeck | 365/19 |

*Primary Examiner*—James W. Moffitt
*Attorney, Agent, or Firm*—Herbert M. Shapiro

[57] ABSTRACT

A Hall detector for magnetic bubbles is characterized by an apertured detection area designed to detect only the return field of the bubble. A series arrangement of the detectors is designed to mate with a bubble expander for detecting a strip domain for detecting the return field associated with a strip domain.

11 Claims, 6 Drawing Figures

MAGNETIC DOMAIN MEMORY WITH HALL EFFECT DETECTOR

FIELD OF THE INVENTION

This invention relates to magnetic storage arrangements which use the Hall effect for the detection of domains and, more particularly, to such arrangements adapted for detection of magnetic bubbles.

DESCRIPTION OF THE PRIOR ART

Magnetic bubbles are well known as are various methods of propagation and detection of magnetic bubbles. Bubble propagation is accomplished by creating changing patterns of localized magnetic field gradients. The changing patterns are created in one method by what is termed a "field-access" mode in response to a reorienting magnetic field. Specifically, the field-access mode is characterized by a pattern of, for example, magnetically soft elements responsive to a magnetic field rotating in the plane in which bubbles are moved. The elements, due to their position and geometry, exhibit the requisite changing patterns of field gradients which move bubbles along a path defined by the elements.

An alternative mode for propagating bubbles is called a "conductor-access" mode. A bubble memory of the conductor-access type is characterized by spaced-apart, electrically-conducting films ("dual-conductor") to which a sequence of current pulses is applied. The apertures contour the currents in the films thus producing the requisite changing field gradients.

There is a variety of ways of detecting bubbles. To date, the most widely used method makes use of a magnetoresistance property of permalloy. In a permalloy field-access device, a magnetoresistance detector is defined conveniently in one stage of a bubble expander-detector and is formed when the permalloy bubble propagation elements are formed. In such an arrangement, the detection element includes a number of chevron-shaped propagation elements as is well understood.

Although it is possible to use a magnetoresistance detector in a dual-conductor circuit, a permalloy propagation pattern is not present in such circuits and there is no opportunity to use a permalloy detector without separate processing.

The Hall effect is well known and has been used to detect flux from magnetic domains. Its use for detecting magnetic bubbles also has been suggested, but there were problems in attaching conductors to a four-terminal Hall device, in forming a Hall detector for an elongated (strip) domain, and in obtaining a large enough output from the flux of a single bubble. Because Hall devices appeared plagued by such problems, and seemingly, offered no advantage to the two-terminal magnetoresistance detector which lends itself to detection of an elongated strip domain, they have not been pursued.

BRIEF DESCRIPTION OF THE INVENTION

This invention is directed at a Hall detector for magnetic bubbles which lends itself to the detection of a strip domain. It is based, in one aspect, upon the recognition that in the plane in which the detector is located, there is as much magnetic flux in the return field of a bubble as there is in the field above bubble itself. Since the return field encompasses an annular region about the bubble, the effective diameter of that field is greater than (and of opposite sign to) that of the bubble. Therefore, a detector designed to detect only that return flux can be of relatively gross scale, an advantage which is increasingly important as bubbles become increasingly smaller. The advantage becomes all the more apparent when it is recognized that a Hall square has to fit well within the bubble diameters (i.e. d/2) in order to detect flux from a bubble while avoiding flux cancellation due to the return field. Consequently, in one embodiment herein, a Hall detector includes a detection area having an annular shape to detect the return field of a bubble without detecting the flux directly above the bubble itself.

In another embodiment, a Hall detector is adapted for use in conjunction with a bubble expander to detect an elongated strip domain. A number of apertured (or unapertured) Hall detectors are connected in series herein in such a way that the impedance of the connecting conductors is sufficiently great to permit an additive effect of the series connection.

A Hall detector with a bubble-sized aperture and the use of a series of Hall detectors either with or without apertures, for the detection of magnetic bubbles and strip domains, respectively, are considered departures from prior art thinking.

DETAILED DESCRIPTION

Figure 1:
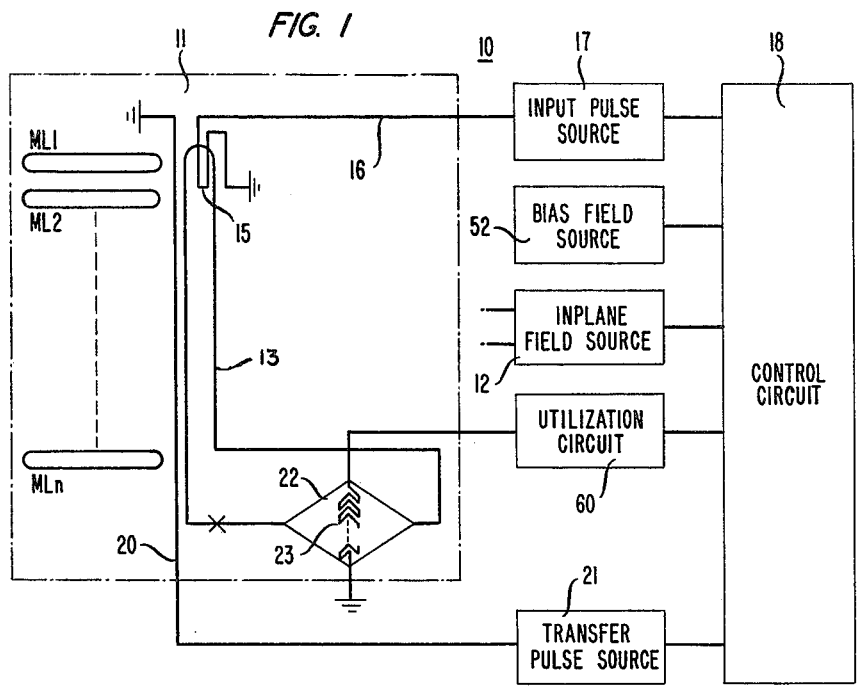
FIG. 1 is a block diagram of a magnetic bubble memory.

FIG. 1 shows a magnetic bubble memory 10 including a layer of material in which magnetic bubbles can be moved. A plurality of loops is defined in layer 11 for recirculating information (bubble patterns) thereabout.

As is well known, bubbles are moved in a "field-access" or a "conductor-access" mode as has been mentioned hereinbefore. The former mode employs a pattern of magnetic elements adjacent the plane of bubble movement. The elements, typically magnetically soft permalloy adjacent the surface of layer 11, respond to a magnetic field reorienting in the plane of bubble movement. A source of a suitable reorienting field is represented by block 13. The field-access mode of operating a bubble memory is disclosed in U.S. Pat. No. 3,534,347 of A. H. Bobeck, issued Oct. 13, 1970.

A conductor-access mode of operating bubble memories is first disclosed in U.S. Pat. No. 3,460,116 of A. H. Bobeck, U. F. Gianola, R. Sherwood, and W. Shockley, issued Aug. 5, 1969. A conductor-access memory employs a pattern of electrically-conducting paths adjacent the plane of bubble movement. Electrical current pulses are applied to the paths resulting in the requisite changing magnetic field gradients which move bubbles. U.S. Pat. No. 4,162,537 of A. H. Bobeck issued July 24, 1979 discloses a conductor-access bubble memory in which the conducting paths are defined by like patterns of apertures in two spaced-apart electrically-conducting films. The patterns are slightly offset with respect to one another in order to respond properly to a pattern of current pulses applied alternately to the two films to generate the requisite field gradients.

Whatever the mode of bubble movement, bubble memories are organized in a "major-minor" configuration as disclosed in U.S. Pat. No. 3,618,054 of P. I. Bonyhard, issued Nov. 2, 1971. The term "major-minor" refers to a plurality of closed minor loops designated $ML_1-ML_n$ in the figure and at least one accessing (major) path 13. Data is entered and retrieved from the accessing path and moved to and from the minor loops for permanent storage there.

Data is entered at 15 in response to an input pulse pattern applied to a "generate" conductor 16 which is connected between an input pulse source 17 and ground. The input pulse pattern is synchronized with a reorienting in-plane drive field by control circuit 18 to produce a bubble pattern moving, say, counterclockwise as viewed in major loop or path 13. The data pattern is transferred to vacancies corresponding to a selected address in the minor loops in response to a pulse in transfer conductor 20 during a write operation. Conductor 20 is connected between a transfer pulse source 21 and ground.

During a read operation, data is transferred from a selected address in the minor loops by a second pulse in conductor 20. The selected data moves, synchronously with the movement of other bubbles in layer 11, to an expansion detector arrangement indicated at 22.

The expansion detector arrangement is defined by successive stages of loop 13 in which the propagate elements are of a geometry and are disposed with respect to one another to elongate a bubble laterally as the bubble advances. At the stage of maximum elongation, a detection element is formed. The detection element is designated 23 in the figure. During a detection phase of each of successive cycles of the in-plane field, detection element 23 is interrogated under the control of control circuit 18 in a manner to generate an indication of the presence or absence of a bubble. The bubble pattern, so detected is returned via loop 13 to transfer positions from which they are transferred to the originating vacancies in the minor loops in a manner described in connection with the write operation hereinbefore.

Figure 2:
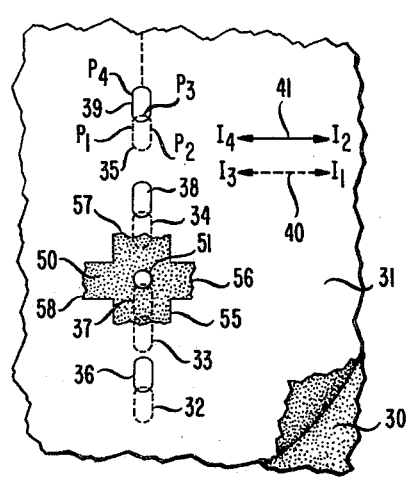
FIGS. 2, 3, 4, 5, and 6 are enlarged top views of alternative portions of a memory of the type shown in FIG. 1.
Figure 3:
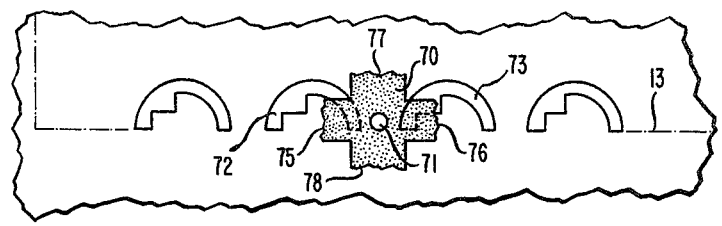

Before describing the working of a distributed Hall detector in an expansion detector arrangement as shown in FIG. 1, we will look at a single-apertured Hall detector operative in conductor-access and field-access modes as shown in FIGS. 2 and 3. Such a detector would be located at point X in the major-minor bubble memory arrangement of FIG. 1 in the absence of the expansion detector arrangement 22.

FIG. 2 shows a Hall detector positioned adjacent a propagation path in a bubble memory operative in the conductor-access mode. The memory includes a bubble propagation layer on which electrically conducting films 30 and 31 are formed. Films 30 and 31 are separated by an electrically-insulating layer (not shown). Oval-shaped apertures 32, 33, 34, and 35 are formed in layer 30 and apertures 36, 37, 38, and 39 are formed in layer 31. A pulse train $I_1$, $I_2$, $I_3$ and $I_4$ applied as indicated by arrows 40 and 41 in FIG. 2 to films 30 and 31 is operative to move bubbles to positions $P_1$, $P_2$, $P_3$ and $P_4$ successively as is well known.

Hall detector 50 is formed in an electrically conducting layer above film 31 as viewed and separated therefrom by an electrically-insulating layer (not shown). Detector 50 includes a centrally-located aperture 51. Aperture 51 has a diameter about equal to that of a bubble in the bubble layer as determined by the familiar bias field supplied by source 52 of FIG. 1. As can be seen in FIG. 2, aperture 51 is positioned to correspond with a position $P_4$ in a propagation cycle.

Detector 50 has four terminals 55, 56, 57, and 58. Terminals 55 and 57 align along the axis of bubble propagation. Terminals 56 and 58 align along an axis astride the path of bubble propagation. During a $P_4$ phase of a (propagation) cycle of the in-plane field, a control circuit (like 18 of FIG. 1) applies a pulse to terminal 55, terminal 57 being connected to ground, and an output is generated across terminals 56 and 58. To this end, terminals 56 and 58 are connected between a utilization circuit, such as 60 of FIG. 1 and ground.

FIG. 3 shows an apertured Hall detector positioned at x in an arrangement of the type shown in FIG. 1, where the bubble paths are formed by permalloy propagate elements. The elements are of the well known asymmetric half disc shape and are operative to move bubbles, from left to right in response to an in-plane field rotating clockwise. The apertured Hall detector is formed in a metallic film over the plane of the propagate elements and separated therefrom by an electrically insulating layer (not shown). The element is identified at 70 and the aperture 71 is shown positioned over the gap between adjacent propagate elements 72 and 73. Terminals 75 and 76 align with the axis of propagation and are pulsed in a manner as described in connection with FIG. 2. An output signal is taken across terminals 77 and 78

The Hall detector of FIG. 2 or FIG. 3 gives an output of the order of 0.1 mv for a bubble of 1.7 microns nominal diameter. The detector itself is formed by sputtering TiFe on an oxide coating over the permalloy pattern.

Figure 5:
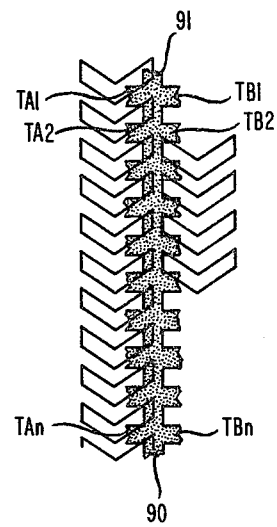
Figure 4:
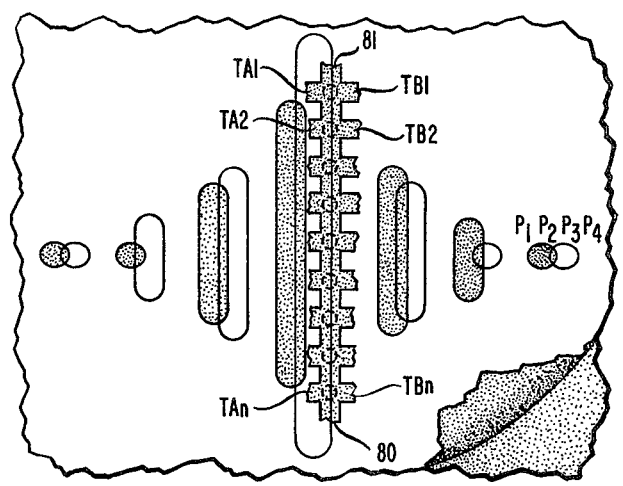

It is the practice in field access, magnetic bubble devices to elongate bubbles laterally before they are detected. FIGS. 4 and 5 show, respectively, conductor-access and permalloy field-access, expansion detector arrangements including series connected Hall detectors.

Figure 6:
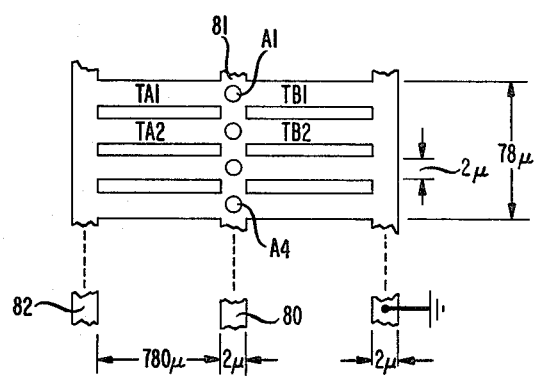

FIG. 6 shows a hypothetical series connected "distributed" Hall detector. The detector is shown separate from any bubble path in order to show more clearly the dimensions and geometry of such an arrangement. It has conductors $T_{a1}$, $T_{a2}-T_{an}$ and $T_{b1}$, $T_{b2}-T_{bn}$ which are parallel and which align along the axis of bubble propagation. Terminals 80 and 81 align along an axis lateral to the direction of propagation in a bubble path associated with the detector. The detection area of the detector comprises the vertical strip extending between terminals 80 and 81. The vertical strip can be seen to include oval apertures $A_1-A_n$. In this illustration, a bubble approaching the detector along a horizontal axis and through an expansion arrangement is expanded laterally with respect to its direction of motion.

The detection area and the conductors $T_{a1}-T_{an}$ and $T_{b1}-T_{bn}$ are assumed to have widths of $2\mu$ (micron) about the size of a bubble. In order for a series arrangement to be operative to give a larger output than is possible with a single Hall detector, the conductors must present enough impedance to allow the outputs of the individual units of the detector to sum. It has been found that this goal is best achieved by having the length of the conductors $T_{a1}-T_{an}$ and $T_{b1}-T_{bn}$ and the length of the detection area in a ratio of 10/1. In this embodiment, the detection area is $78\mu$ and the conductors on each side are $780\mu$ long.

All the conductors $T_{ai}$ and $T_{bi}$ are connected between common conductors 82 and ground as shown. During each propagation cycle, control circuit 18 of FIG. 1 applies a pulse to conductor 82. In the presence of a strip domain, an output is generated across terminals 80 and 81 and applied to utilization circuit 60 of FIG. 1.

FIG. 4 shows a distributed Hall detector of FIG. 6 positioned in a conductor-access expansion detector arrangement. As described in connection with FIG. 2, this expansion detector arrangement includes a bubble propagation layer and electrically conducting films 30 and 31, separated by an electrically insulating layer. In successive stages of the expansion detector arrangement, the apertures in the conducting films are elongted in a direction transverse to the direction of bubble movement, thus being operative to expand the bubble laterally with respect to its direction of propagation. The detector is shown again with parallel conductors $T_{a1}$-$T_{an}$ and $T_{b1}$-$T_{bn}$ defining a detection area 80-81 astride the bubble path. The detector is positioned at the point of maximum expansion of the bubble, so that detection area 80-81 (as in FIG. 6) corresponds with a $P_4$ position. As in FIG. 2, the detector and associated conductors are formed in an electrically conducting film on top of layer 31 and separated therefrom by an electrically insulating layer. It is to be understood that the distributed Hall detector shown in FIG. 4 can be either apertured or unapertured as indicated by the dotted circle in the figure.

Terminals $T_{a1}$-$T_{an}$ and $T_{b1}$-$T_{bn}$, understood to be connected between control circuit 18 (FIG. 1) and ground as in FIG. 6, are arranged electrically in parallel and align along an axis parallel to the direction of bubble motion. Output terminals 80 and 81 are connected to utilization circuit 60 of FIG. 1 and align along an axis lateral to the direction of motion. During a $P_4$ phase of the propagation cycle, control circuit 18 applies an interrogate pulse to terminals $T_{a1}$-$T_{an}$ and an output is generated across terminals 80 and 81. The expanded strip domain continues along the propagation path and is collapsed to bubble size by the operation of the downstream side of the expansion detection arrangement. The bubble continues along path 13 (FIG. 1) to be transferred back into a minor loop as described above.

In FIG. 5, we see the distributed detector in a permalloy field-access expander-detector arrangement. The operation of such an expander-detector arrangement is well understood. Each stage of the detector comprises a larger number of chevron-shaped propagation elements operative to expand the bubble in a direction lateral to the direction of motion. As described in connection with FIG. 3, the detector, formed in a conducting film on top of the propagation layer and insulated therefrom, is positioned with detection area 90-91 in the gap between adjacent stages of the expander-detector arrangement. As in the embodiment of FIG. 4, the detector is located at the stage of maximum expansion of the bubble. The terminals are aligned and pulsed in the manner described in connection with FIG. 4. Here also, the detection area may be apertured to optimize the response to the return field of a strip domain being propagated through the expander-detector arrangement.

I claim:

1. An arrangement comprising a layer of material in which magnetic domains can be moved, means for moving domains along a path in said layer to an output position, a detector made of a magnetic material responsive to a change in magnetic flux positioned at said output position, said detector having at least first and second terminals, means for providing an electric current to said first and second terminals, and means for detecting the effect of a domain on said current, said arrangement being characterized in that said magnetic material including an apeture at said output position.

2. Apparatus in accordance with claim 1 wherein said domains comprise magnetic bubbles and said means for moving domains comprises a pattern of magnetically soft elements responsive to a magnetic field rotating in the plane in which domains are moved and said aperture has a diameter about equal to that of a bubble.

3. Apparatus in accordance with claim 1 wherein said means for moving domains comprises two apertured, spaced-apart, electrically-conducting films wherein bubbles move in response to electrical pulses applied to said films.

4. An arrangement comprising a layer of material in which magnetic domains can be moved, means for moving domains along a path in said layer, means for defining a detector stage in said path where a domain moved therein expands along an axis extending laterally with respect to the axis of said path, a detector comprising a plurality of Hall detectors connected in series and defining a detection area at said detection stage, a plurality of electrical conductors connected to said Hall detectors at said detection area, each of said conductors having a geometry to present sufficient impedance to allow outputs of said Hall devices to sum electrically, means for providing electric currents to said conductors and output means connected to said detection area for detecting the effect of a domain on said current.

5. Apparatus in accordance with claim 4 wherein said conductors extend in a direction parallel to the direction of movement of a domain.

6. Apparatus in accordance with claim 5 wherein said means for detecting the effect of a domain on said current comprises a pair of electrical terminals affixed to said detection area, said terminals aligning along an axis transverse to the direction of movement of a domain.

7. Apparatus in accordance with claim 6 wherein each of said detectors comprises a detector with first, second, third, and fourth terminals, and a planar, apertured detection area.

8. Apparatus in accordance with claim 6 wherein said means for moving domains comprises a pattern of magnetically soft elements responsive to a magnetic field rotating in the plane in which bubbles are moved.

9. Apparatus in accordance with claim 6 wherein said means for moving domains comprises two-apertured, spaced-apart, electrically-conducting films wherein domains move in response to electrical pulses.

10. Apparatus in accordance with claim 8 wherein said means for moving includes a multistage pattern of chevron-shaped elements where consecutive stages comprise increasingly larger numbers of elements operative in response to a rotating in-plane field to expand domains laterally with respect to direction of movement of domains to a position of maximum expansion at said detection stage.

11. Apparatus in accordance with claim 9 wherein said electrically-conducting films comprise slots of successively increasing length operative to expand domains laterally with respect to direction of movement of domains, to a position of maximum expansion said detector being centered on the axis extending laterally with respect to said direction of movement at said position of maximum expansion.

* * * * *